(12) United States Patent
Gipson et al.

(10) Patent No.: US 10,705,290 B2
(45) Date of Patent: Jul. 7, 2020

(54) LIGHT GUIDE PLATE PROVIDING PROTECTION FOR ELECTRONICS COMPONENTS OF A PRINTED CIRCUIT BOARD

(71) Applicant: Dura Operating, LLC, Auburn Hills, MI (US)

(72) Inventors: Ron G. Gipson, Metamora, MI (US); Bhanumurthy Veeragandham, Auburn Hills, MI (US)

(73) Assignee: DURA OPERATING, LLC, Auburn Hills, MI (US)

(*) Notice: Subject to any disclaimer, the term of this patent is extended or adjusted under 35 U.S.C. 154(b) by 0 days.

(21) Appl. No.: 16/109,196

(22) Filed: Aug. 22, 2018

(65) Prior Publication Data

US 2020/0064544 A1 Feb. 27, 2020

(51) Int. Cl.
| | |
|---|---|
| *F21V 8/00* | (2006.01) |
| *H05K 1/18* | (2006.01) |
| *H05K 5/06* | (2006.01) |
| *H05K 1/02* | (2006.01) |

(52) U.S. Cl.
CPC ......... *G02B 6/0095* (2013.01); *G02B 6/0016* (2013.01); *G02B 6/0031* (2013.01); *G02B 6/0091* (2013.01); *H05K 1/0274* (2013.01); *H05K 1/181* (2013.01); *H05K 5/065* (2013.01); *H05K 2201/09063* (2013.01); *H05K 2201/10106* (2013.01); *H05K 2201/10121* (2013.01); *H05K 2201/10522* (2013.01)

(58) Field of Classification Search
CPC .. G02B 6/0095; G02B 6/0016; G02B 6/0031; G02B 6/0091; H05K 1/0274; H05K 1/181; H05K 5/065; H05K 2201/09063; H05K 2201/10106; H05K 2201/10121; H05K 2201/10522
See application file for complete search history.

(56) References Cited

U.S. PATENT DOCUMENTS

| | | |
|---|---|---|
| 5,947,578 A | 9/1999 | Ayres |
| 9,485,870 B2 | 11/2016 | Mayo et al. |
| 9,841,553 B2 * | 12/2017 | Kim ..................... G02B 6/0088 |

(Continued)

FOREIGN PATENT DOCUMENTS

| | | |
|---|---|---|
| WO | 2009075924 A1 | 6/2009 |
| WO | 2017077193 A1 | 5/2017 |

(Continued)

*Primary Examiner* — Mary Ellen Bowman
(74) *Attorney, Agent, or Firm* — Vivacqua Crane PLLC

(57) ABSTRACT

A molded component assembly includes a printed circuit board with a first face and an oppositely facing second face. Multiple light emitting diodes are mounted on a first portion of the first face. Multiple electronics components are mounted on a second portion of the first face. A light guide of a light translucent polymeric material is positioned over the light emitting diodes and the electronic components. The light guide includes: a contact surface directly contacting the first portion of the first face except at locations of the light emitting diodes; a cavity created in the contact surface, the electronics components located within the cavity when the contact surface directly contacts the first portion of the first face; and a through hole extending through a body of the light guide and opening into the cavity.

20 Claims, 5 Drawing Sheets

(56) References Cited

U.S. PATENT DOCUMENTS

| | | | |
|---|---|---|---|
| 9,869,810 B2 | 1/2018 | Keranen et al. | |
| 2011/0037728 A1* | 2/2011 | Gourlay | G02B 6/0043 |
| | | | 345/174 |
| 2012/0001538 A1* | 1/2012 | Kim | H01L 25/0753 |
| | | | 313/512 |
| 2012/0327682 A1* | 12/2012 | Kim | G02B 6/0018 |
| | | | 362/602 |
| 2013/0176746 A1* | 7/2013 | Nishimura | H05K 1/189 |
| | | | 362/382 |
| 2015/0138831 A1* | 5/2015 | Okano | G02B 6/0021 |
| | | | 362/609 |
| 2016/0358896 A1* | 12/2016 | Jeon | H01L 25/0753 |
| 2018/0162026 A1* | 6/2018 | Stvartak | B29C 45/0001 |
| 2018/0180795 A1* | 6/2018 | Stvartak | G02B 6/0021 |
| 2019/0064422 A1* | 2/2019 | Kim | G02B 6/0053 |
| 2019/0196085 A1* | 6/2019 | Gipson | G02B 6/0021 |

FOREIGN PATENT DOCUMENTS

| | | |
|---|---|---|
| WO | 2017142487 A1 | 8/2017 |
| WO | 2017178702 A1 | 10/2017 |

* cited by examiner

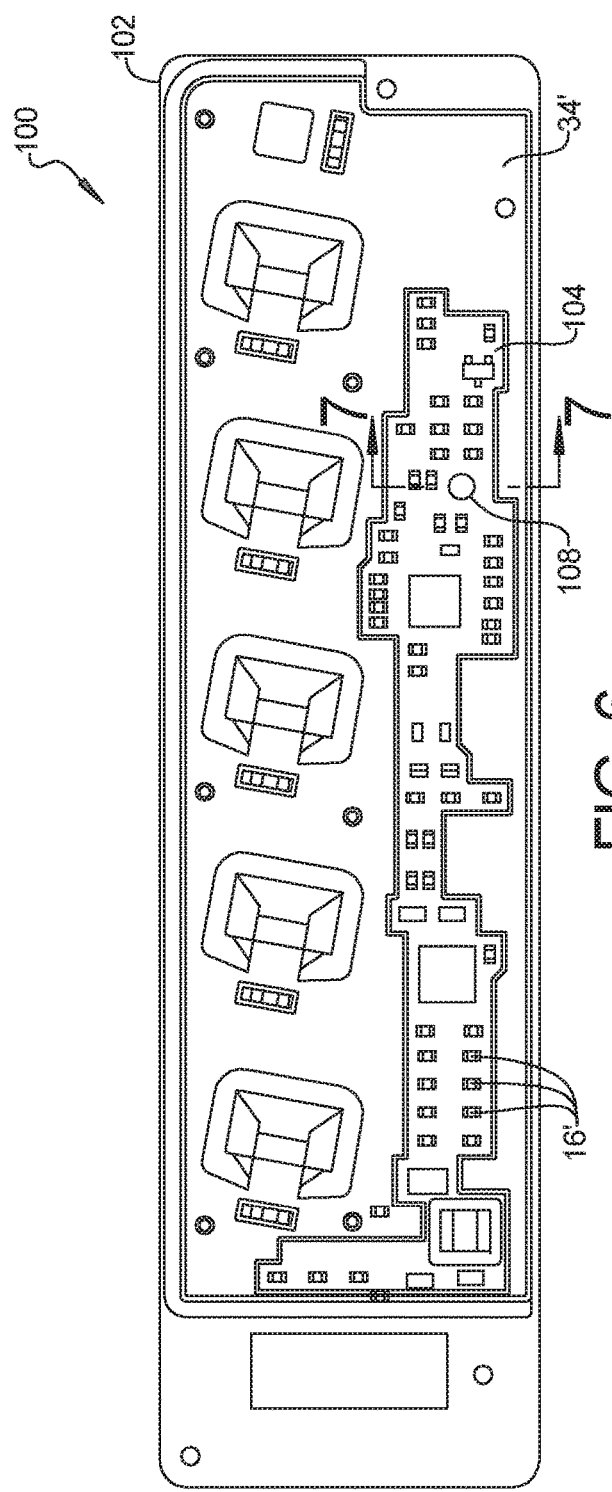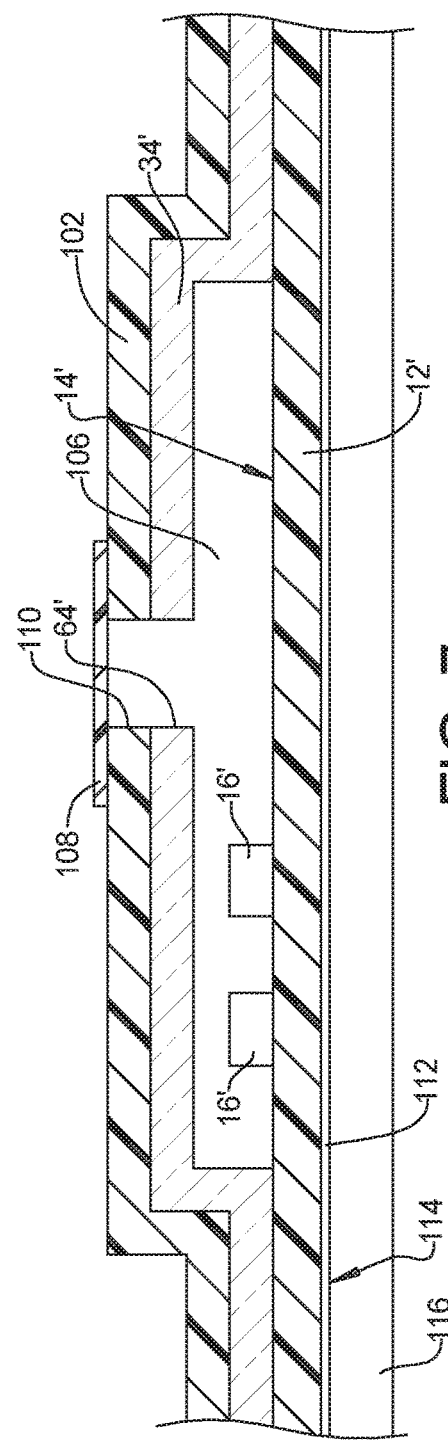

LIGHT GUIDE PLATE PROVIDING PROTECTION FOR ELECTRONICS COMPONENTS OF A PRINTED CIRCUIT BOARD

FIELD

The present disclosure relates generally to printed circuit boards having at least one light generating component and a light guide.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronics components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronics components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronics components may also be printed onto a film. The film is then inserted into an injection mold, where plastic is molded onto the film, the electronics components being embedded in the molded plastic so that when the plastic part is removed from the mold the film is peeled away from the plastic part, leaving the electronics components embedded in or adhered to the surface of the plastic part.

Air entrapped in cavities within an assembly when over molded with plastic resin injected at high temperature and pressure can cause many failures to the systems design. These failures can be electrical, mechanical and surface quality failures.

Thus, while current printed film assemblies achieve their intended purpose, there is a need for a new and improved system and method for preparing light guides used for film assemblies having light emitting diodes.

SUMMARY

According to several aspects, a molded component assembly includes a printed circuit board with a first face and an oppositely facing second face. A light emitting diode is mounted on a first portion of the first face. An electronics component is mounted on a second portion of the first face. A light guide of a light translucent polymeric material is positioned proximate to the light emitting diode. The light guide includes: a contact surface directly contacting the first portion of the first face; and a cavity created in the contact surface, the cavity positioned over the electronics component.

In another aspect of the present disclosure, the light guide includes a through hole extending through a body of the light guide and opening into the cavity.

In another aspect of the present disclosure, the light guide further includes: a light outlet aligned to receive visible light emitted from the light emitting diode; and an integrally formed light reflector positioned proximate to the light outlet.

In another aspect of the present disclosure, the printed circuit board includes a through aperture extending from the first face to the second face, with the light outlet aligned with the through aperture. A distal end of the light reflector defines a substantially flat face having a geometry that substantially matches a geometry of the through aperture, with the distal end positioned substantially flush with the second face of the printed circuit board.

In another aspect of the present disclosure, a low pressure molding polymeric material is injected through the through hole and fills the cavity and the light outlet and encapsulates the electronics component.

In another aspect of the present disclosure, a layer of a polymeric material positioned over the light guide. An alignment aperture extends clearly through the layer which is aligned with the through hole.

In another aspect of the present disclosure, a patch of a polymeric material covers the alignment aperture, the patch thereby also covering the through hole.

In another aspect of the present disclosure, the patch is an expanded polytetrafluoroethylene material which repels liquid water, but allows water vapor and air to pass through, allowing air to enter and escape the cavity but preventing liquid water from entering the alignment aperture and the through hole.

In another aspect of the present disclosure, a through hole extends through a body of the light guide and opening into the cavity. A conformal filler layer of a low temperature and low pressure molded polymeric material is created by injecting the polymeric material through the through hole into the partial cavity.

In another aspect of the present disclosure, the conformal filler layer includes an overmolding portion over-molded onto and covering the electronics component, and directly contacting the first face of the body.

In another aspect of the present disclosure, the conformal filler layer includes a filler member co-molded with and homogeneously connected to the overmolding portion by a bridge member, the filler member back-fills a cavity defining the light outlet.

In another aspect of the present disclosure, the conformal filler layer is white in color to reflect visible light created when the light emitting diodes are energized preventing the visible light from escaping through the light guide.

In another aspect of the present disclosure, the light guide includes a light emitting diode receiving pocket recessed into the contact surface, the pocket having a shape corresponding to a shape of the light emitting diode and sized to receive the light emitting diode when the contact surface directly contacts the first portion of the first face.

In another aspect of the present disclosure, the pocket includes an incident surface, the incident surface including a texture to control transmission of the visible light to the light guide.

According to several aspects, a molded component assembly includes a printed circuit board with a first face and an oppositely facing second face. Multiple light emitting diodes are mounted on a first portion of the first face. Multiple electronics components are mounted on a second portion of the first face. A light guide of a light translucent polymeric material is positioned over the light emitting diodes and the electronic components. The light guide includes: a contact surface directly contacting the first portion of the first face except at locations of the light emitting diodes; a cavity created in the contact surface, the electronics components located within the cavity when the contact surface directly contacts the first portion of the first face; and a through hole extending through a body of the light guide and opening into the cavity.

In another aspect of the present disclosure, the light guide further includes multiple light outlets individually aligned with one of the light emitting diodes to receive visible light emitted from the light emitting diodes, each of the light outlets defining an aperture having a generally U-shaped inner wall oriented substantially perpendicular to an outer surface of the light guide.

In another aspect of the present disclosure, the light guide further includes multiple integrally formed light reflectors individually positioned proximate to one of the light outlets, with each of the multiple light reflectors homogeneously connected to the light guide and each including a neck portion extending the light reflector at least partially into one of multiple through apertures created in the printed circuit board.

In another aspect of the present disclosure, a layer of a polymeric material positioned over the light guide. An alignment aperture extends clearly through the layer which is aligned with the through hole. A patch of a polymeric material covers the alignment aperture, the patch thereby also covering the through hole. The patch is of an expanded polytetrafluoroethylene material which repels liquid water, but allows water vapor and air to pass through, allowing air to enter and escape the cavity but preventing liquid water from entering the alignment aperture and the through hole.

In another aspect of the present disclosure a first polymeric material is injected through the through hole and overmolds the second portion of the first face encapsulating the electronics components. A second polymeric material is positioned over the second face of the printed circuit board having translucent openings positioned over each of a plurality of through apertures created in the printed circuit board. The translucent openings define successive number pairs.

According to several aspects, a molded component assembly includes a printed circuit board with a first face and an oppositely facing second face. Multiple light emitting diodes are mounted on a first portion of the first face. Each of the light emitting diodes defines a side-firing diode having visible light emitted from the light emitting diodes directed generally parallel to the first face. Multiple electronics components are mounted on a second portion of the first face. A light guide of a light translucent polymeric material is positioned over the light emitting diodes and the electronic components. The light guide includes: a contact surface directly contacting the first portion of the first face except at locations of the light emitting diodes; a cavity created in the contact surface, the electronics components located within the cavity when the contact surface directly contacts the first portion of the first face; a through hole extending through a body of the light guide and opening into the cavity; multiple light outlets individually aligned with one of the light emitting diodes to receive visible light emitted from the light emitting diodes, each of the light outlets defining an aperture; and multiple integrally formed light reflectors individually positioned proximate to one of the light outlets, each of the light reflectors including multiple beveled surfaces to reflect the visible light to the light outlets.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 6 is a top plan view of the molded component assembly of FIG. 5;

FIG. 7 is a cross sectional end elevational view taken at section 7 of FIG. 6.

DETAILED DESCRIPTION

The following description is merely exemplary in nature and is not intended to limit the present disclosure, application, or uses.

Figure 1:
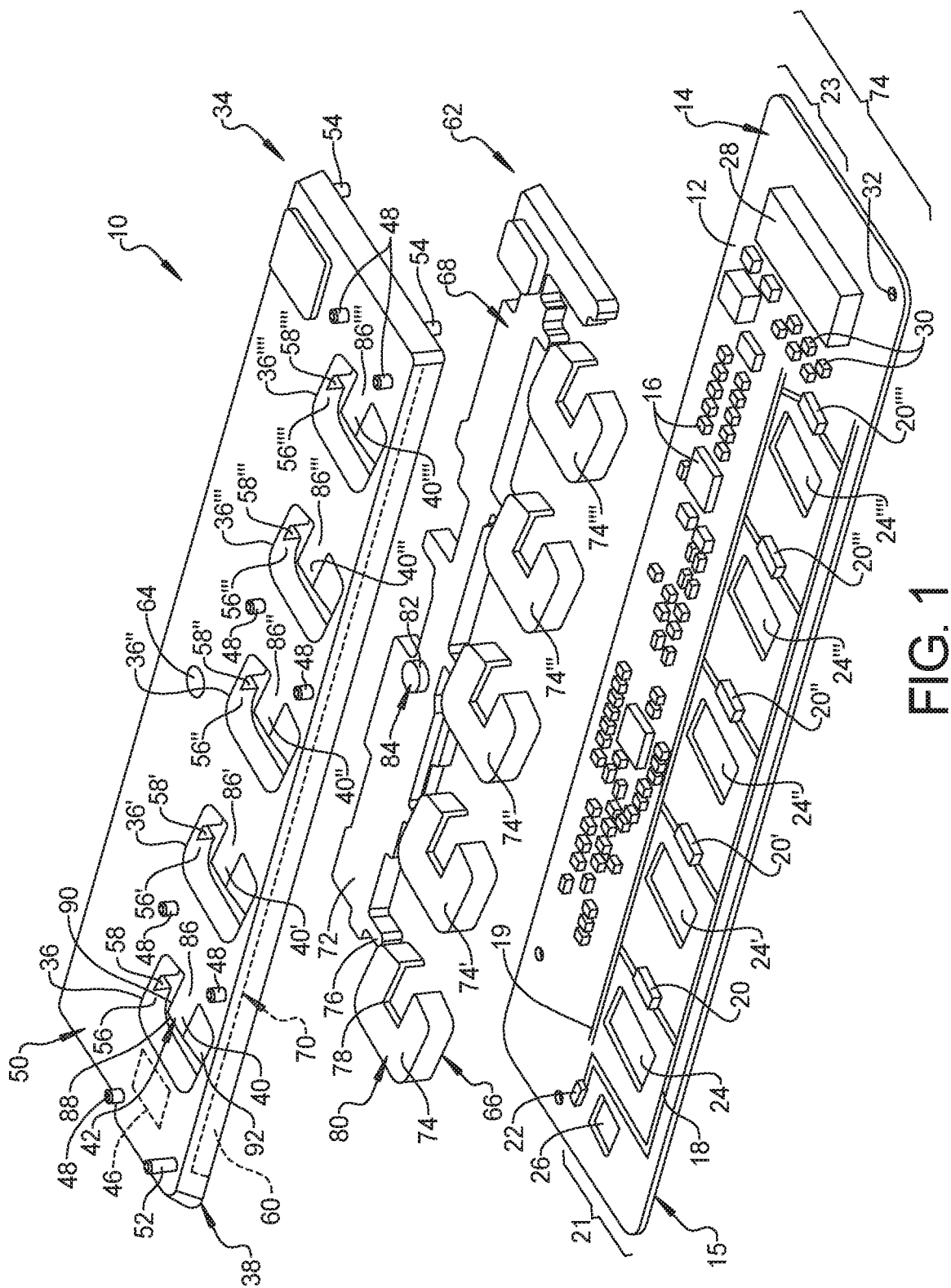
FIG. 1 is a front perspective assembly view of a molded component assembly according to an exemplary embodiment.

Referring to FIG. 1, a laminated light guide and component carrier defining a molded component assembly 10 includes a molded polymeric material or a metal body 12 such as a printed circuit board having multiple electrical components mounted thereon. According to several aspects, the body 12 defines a rectangular shape, however any desired geometric shape may be used. The body 12 includes a first side or first face 14 and an oppositely directed second face 15. On the first face 14 of the body 12 are located multiple electronics components 16 including capacitors, which are electrically connected to a plurality of first electrical traces 18, 19 (only partially shown for clarity) printed for example by a screen printing process onto the first face 14.

Multiple light emitting diodes 20, 20', 20'', 20''', 20'''' are also individually mounted on a first portion 21 of the first face 14 and are connected to the electrical traces 18, 19. An additional light emitting diode 22 can optionally be provided at one end of the first portion 21 of the first face 14 of the body 12 to provide an illuminated indication that electrical power is available for the molded component assembly 10.

According to several aspects, the multiple electronics components 16 are disposed on a second portion 23 of the first face 14 of the body 12. According to several aspects, the light emitting diodes 20, 20', 20", 20'", 20"", 22 define side firing diodes, with visible light emitted from the light emitting diodes directed generally parallel to the first face 14.

Positioned proximate to each of the light emitting diodes 20, 20', 20", 20'", 20"", 22 are multiple individual through apertures 24, 24', 24", 24'", 24"" created in the body 12. According to several aspects each of the through apertures 24, 24', 24", 24'", 24"" are square or rectangular shaped, however any geometry can be selected. A separate through aperture 26 may also be provided proximate to the light emitting diode 22, which is similar to the through apertures 24, 24', 24", 24'", 24"" in function, but may have a smaller cross section. Also positioned on the first face 14 of the body 12 is a connector 28 which is connected to the electrical traces 18, 19. Multiple capacitive touch film contacts 30 are provided proximate to a space envelope of the connector 28. Multiple through apertures 32 are provided through the body 12 which frictionally receive pins discussed below.

A light guide 34 is molded from a single injection molding shot of an optically clear polymeric material such as polymethyl methacrylate (PMMA) which is transparent or translucent to allow light passage through the light guide 34. Multiple generally U-shaped cavities defining light outlets 36, 36', 36", 36'", 36"" are created through the light guide 34 each aligned with individual ones of the through apertures 24, 24', 24", 24'", 24"" when a contact surface 38 of the light guide 34 is placed in direct contact with the first face 14 of the body 12. Multiple light lenses or light reflectors 40, 40', 40", 40'", 40"", co-molded of the PMMA material and homogeneously connected to the light guide 34 each extend over or into one of the light outlets 36, 36', 36", 36'", 36"". Each of the light reflectors 40, 40', 40", 40'", 40"" includes a planar reflector surface 42 oriented substantially parallel to the contact surface 38. When the light guide 34 is positioned on the body 12 each of the light reflectors 40, 40', 40", 40'", 40"" substantially overlaps one of the through apertures 24, 24', 24", 24'", 24"" with male pins of the light guide 34 press-fit into the apertures 32 described above extending through the first face 14 of the body 12. A separate light reflector 46 portion of the light guide 34 also co-molded of the PMMA material and homogeneously connected to the light guide 34 overlaps the through aperture 26 when the light guide 34 is positioned on the body 12.

According to several aspects, the light guide 34 covers a majority of the first face 14 of the body 12, and a shape of the light guide 34 is similar to a shape of the first face 14 to allow the majority coverage. The light guide 34 further includes an outer surface (no number) that is generally planar and aligned with the first face 14.

Multiple male projections defining first pins 48 co-molded of the PMMA material and homogeneously connected to the light guide 34 extend upwardly as viewed in FIG. 1 away from an outer surface 50 of the light guide 34. A separate male projection defining an alignment pin 52 which is longer than the first pins 48 can also be provided. In addition to the first pins 48 extending from the outer surface 50, multiple male projections defining second pins 54, only two of which are partially visible in this view, extend downwardly away from the contact surface 38. Each of the second pins 54 is frictionally received in one of the through apertures 32 formed in the body 12 when the light guide 34 is press-fit onto the first face 14 of the body 12.

Each of the light outlets 36, 36', 36", 36'", 36"" defines an aperture having a generally U-shaped inner wall 56, 56', 56", 56'", 56"" oriented substantially perpendicular to the outer surface 50. An opening 58, 58', 58", 58'", 58"" is created in each of the inner walls 56, 56', 56", 56'", 56"" to provide clearance for through passage of electrical power supplies such as the electrical traces 19 to supply electrical power to the light emitting diodes 20, 20', 20", 20'", 20"" when the contact surface 38 of the light guide 34 is press-fit onto the first face 14 of the body 12. A partial cavity 60 is also provided in the light guide 34 facing downward as viewed in FIG. 1, defining a recess formed with respect to the contact surface 38. According to several aspects, after the light guide 34 is frictionally mounted onto the first face 14 of the body 12 using the second pins 54, a conformal filler layer 62 of a low temperature and low pressure molded polymeric material is created by injecting the polymeric material through a through hole 64 extending through the light guide 34 into the partial cavity 60, substantially filling the partial cavity 60 to create the conformal filler layer 62.

The conformal filler layer 62 of the low temperature and low pressure molding polymeric material such as a low pressure molding (LPM) resin, an epoxy, or a conformal filler material when injected through the through hole 64 also back-fills each of the light outlets 36, 36', 36", 36'", 36"". A lower first surface 66 of the conformal filler layer 62 directly contacts the first face 14 of the body 12 and an oppositely facing upper second surface 68 of the conformal filler layer 62 directly contacts an inner wall 70 of the light guide 34 within the partial cavity 60. An overmolding portion 72 of the conformal filler layer 62 is over-molded onto and covers the electronics components 16, and directly contacts the portion 23 of the first face 14 of the body 12. According to several aspects, the conformal filler layer 62 is white in color to reflect visible light created when the light emitting diodes 20, 20', 20", 20'", 20'", 22 are energized which would otherwise escape through the light guide 34 and return the light back into the light guide 34.

The conformal filler layer 62 also includes multiple filler members 74, 74', 74", 74'", 74"" which are co-molded with and homogeneously connected to the overmolding portion 72 by individual bridge members 76. To conserve weight and material costs and to reduce light or heat transfer, the bridge members 76 have a width which is less than a width of either the overmolding portion 72 or the filler members 74, 74', 74", 74'", 74"" and a thickness less than a thickness of the filler members 74, 74', 74", 74'", 74"". Each of the filler members 74, 74', 74", 74'", 74"" back-fills one of the cavities defining the light outlets 36, 36', 36", 36'", 36"" extending through the light guide 34. The filler members 74, 74', 74", 74'", 74"" each include a U-shaped opening 78 which conforms about the geometry of one of the planar reflector surfaces 42 of each of the light reflectors 40, 40', 40", 40'", 40'", and conforms about beveled reflector surfaces described in greater detail below. An outward facing surface 80 of each of the filler members 74, 74', 74", 74'", 74"" may be co-planar with the outer surface 50 of the light guide 34. A plug 82 is formed when polymeric material of the conformal filler layer 62 solidifies in the through hole 64. An outward facing surface 84 of the plug 82 is also co-planar with the outer surface 50 of the light guide 34. A neck portion 86, 86', 86", 86'", 86"" of light guide material homogeneously connects the light guide 34 to each of the light reflectors 40, 40', 40", 40'", 40'".

Figure 8:
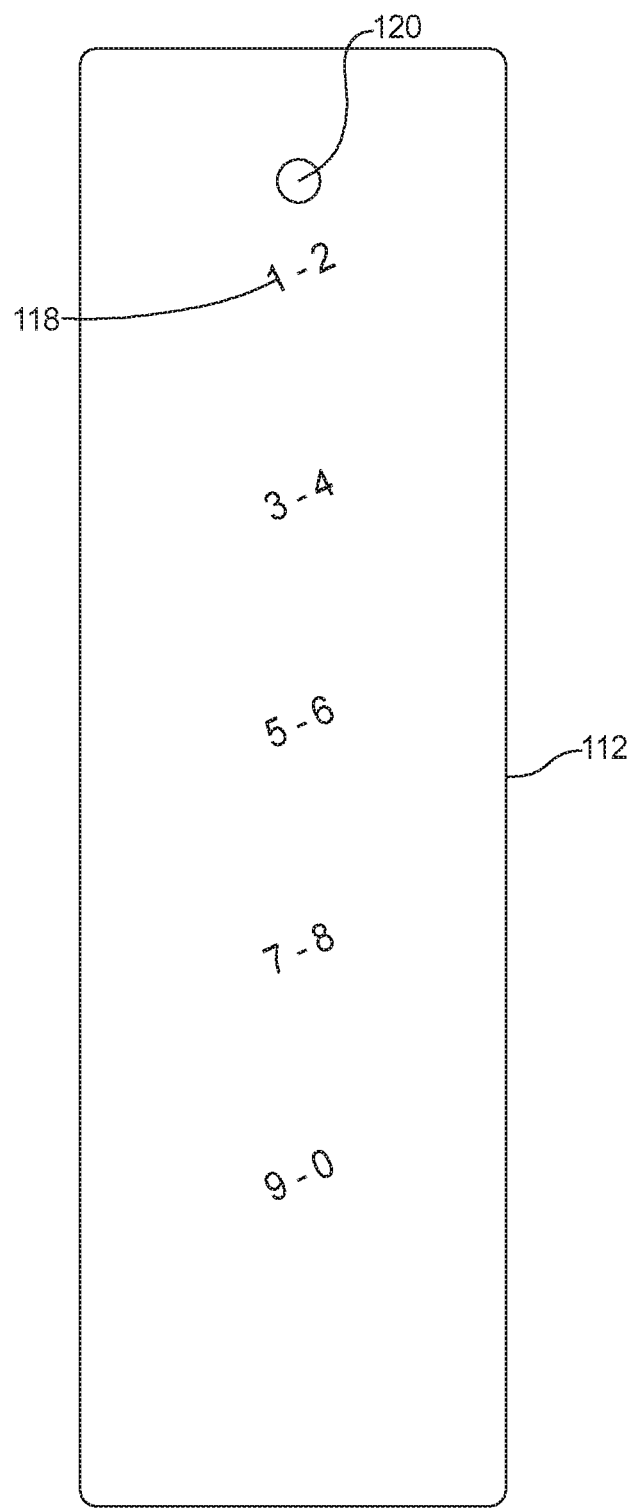
FIG. 8 is a bottom plan view of the assembled molded component of FIG. 1.

With continuing reference to FIG. 1, light rays as visible light emitted from the light emitting diodes 20, 20', 20", 20'", 20"" reflect off multiple beveled surfaces of each of the light reflectors 40, including a first reflector surface 88, a second reflector surface 90 and a third reflector surface 92 which are oriented non-orthogonal to the contact surface 38, and which direct the light rays out the through apertures 24, 24', 24", 24'", 24"". Light rays emitted by the light emitting diode 22 are directed out the through aperture 26. The light rays as visible light pass through graphics created on a finish layer of an acrylonitrile butadiene styrene (ABS) plastic (shown and described in reference to FIG. 8) of the molded component assembly 10. The beveled surfaces 88, 90, 92 are each oriented approximately 45 degrees with respect to the contact surface 38 which is oriented parallel to the outer surface 50 of the light guide 34. The beveled surfaces 88, 90, 92 reflect and direct the light to intensify the light toward a center of each of the light reflectors 40. Visible light emitted by the light emitting diodes 20, 20', 20", 20'", 20"", 22 also reflects off each of the filler members 74, 74', 74", 74'", 74"" back toward the light guide 34 and the body 12, and is thereby available to be reflected off the multiple beveled surfaces 88, 90, 92 and out the through apertures 24, 24', 24", 24'", 24"".

Referring to FIG. 2 and again to FIG. 1, a completed assembly of the molded component assembly 10 provides the light guide 34 frictionally coupled onto the first face 14 of the body 12 using the second pins 54. After low pressure injection of the polymeric material to form the conformal filler layer 62, the filler members 74, 74', 74", 74'", 74"" surround each of the light reflectors 40, 40', 40", 40'", 40"" except at locations of the neck portions 86, 86', 86", 86'", 86"" of light guide material which homogeneously connects the light guide 34 to each of the light reflectors 40, 40', 40", 40'", 40"". Each of neck portions 86, 86', 86", 86'", 86"" has a smaller width and/or a reduced cross sectional area compared to a body 94 of the light guide 34 and transmits visible light from one of the light emitting diodes 20, 20', 20", 20'", 20"" to one of the light reflectors 40, 40', 40", 40'", 40'". In the assembled condition, visible light generated by each of the light emitting diodes 20, 20', 20", 20'", 20"" is directed primarily into the light reflectors 40, 40', 40", 40'", 40'".

Each light reflector 40 disperses light out via one of the through apertures 24, 24', 24", 24'", 24"". For example light from the light emitting diode 20 is dispersed through the light reflector 40 out via the through aperture 24. The openings provided in the light guide 34 filled by the filler members 74 surrounding the light reflectors 40 help limit light dispersion through only one of the through apertures via only one of the light reflectors, such as through the through aperture 24 via the light reflector 40.

Figure 2:
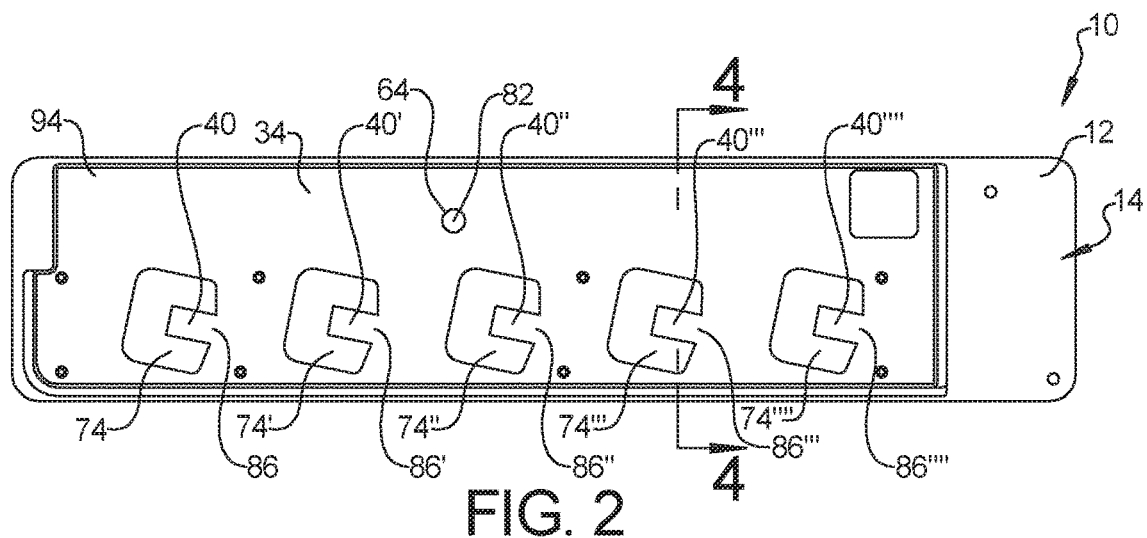
FIG. 2 is a top plan view of an assembled molded component assembly of FIG. 1.

Referring to FIG. 3 and again to FIGS. 1 through 2, as viewed looking toward the second face 15 of the body 12 a portion of each of the light reflectors 40, 40', 40", 40'", 40"" and a portion of each of the filler members 74, 74', 74", 74'", 74"" partially surrounding each of the light reflectors 40, 40', 40", 40'", 40"" is visible in each of the through apertures 24, 24', 24", 24'", 24"". According to several aspects the portion of each of the light reflectors 40, 40', 40", 40'", 40"" extending into each of the through apertures 24, 24', 24", 24'", 24"" is positioned substantially flush with the second face 15. According to further aspects the portion of each of the light reflectors 40, 40', 40", 40'", 40"" extending into each of the through apertures 24, 24', 24", 24'", 24"" is positioned within a thickness of the body 12 and is therefore spaced apart from the second face 15.

Figure 3:
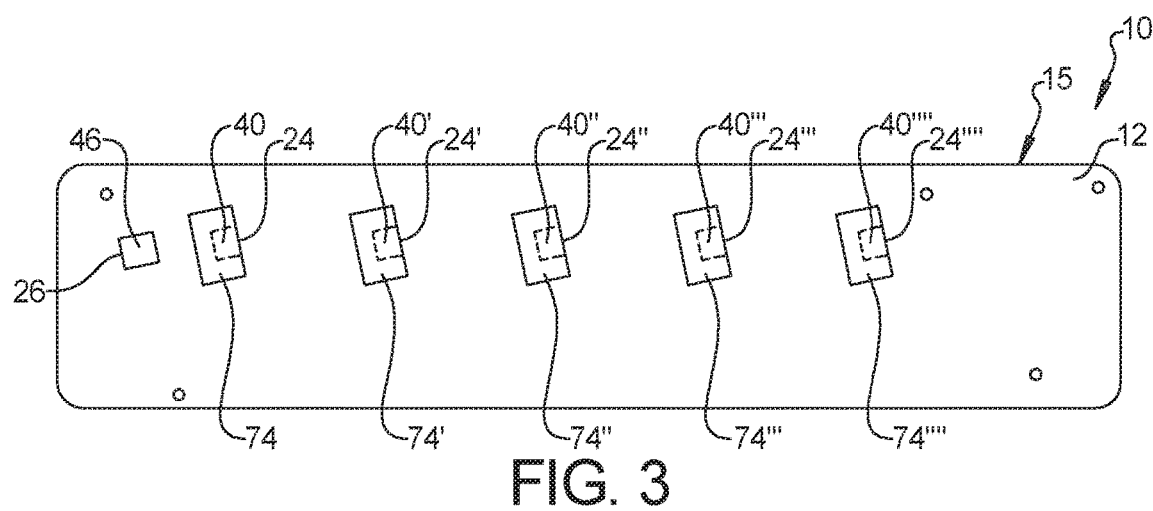
FIG. 3 is a bottom plan view of the assembled molded component assembly of FIG. 1.
Figure 4:
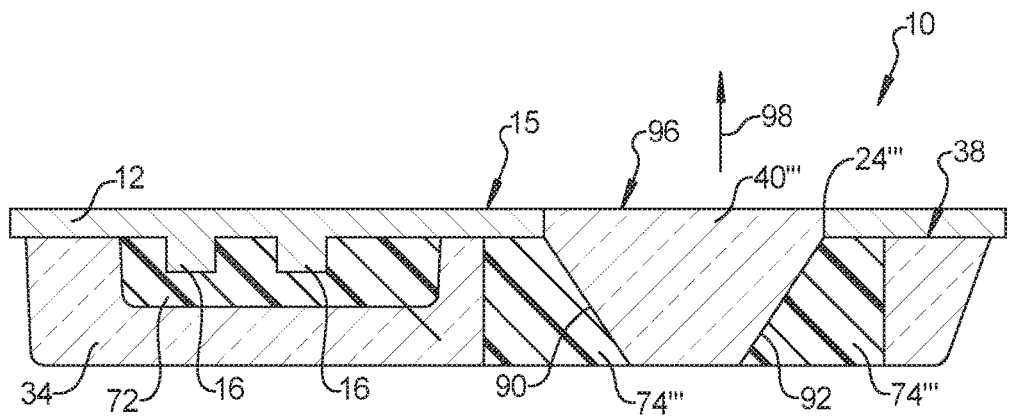
FIG. 4 is a cross sectional end elevational view taken at section 4 of FIG. 2.

Referring to FIG. 4 and again to FIGS. 1 through 3, an exemplary one of the multiple filler members 74'" and an exemplary one of the reflectors 40'" are shown in the installed position. The following discussion of the filler member 74'" and the light reflector 40'" therefore applies equally to all of the filler members and light reflectors. The filler member 74'" substantially fills a perimeter of the through aperture 24'" except at the position of the reflector 40'". Light emitted by the light emitting diode 20'" enters the light reflector 40'" in a direction of the viewer of FIG. 4 and therefore parallel to each of the contact surface 38 of the light guide 34 and the second face 15 of the body 12. A distal end 96 of the light reflector 44'" defines a substantially flat face having a geometry that substantially matches a geometry of the through aperture 24'", and thereby covers the through aperture 24'" to create a light outlet. According to several aspects, the distal end 96 is positioned flush with the second face 15 of the body 12. According to further aspects, the distal end 96 is positioned at least partially within the through aperture 24'" but is spaced apart from the second face 15 of the body 12. Light generated by the light emitting diode 20'" enters the light reflector 44'", reflects off each of the beveled surfaces 88 (not visible in this view), 90 and 92, and is dispersed from the distal end 96 defining the light outlet from the through aperture 24'" in a direction of an arrow 98.

Referring generally to FIG. 5 and again to FIG. 1, according to further aspects, a molded component assembly 100 is modified from the molded component assembly 10 and includes similar components identified with a prime symbol, such as the body 12' and the light guide 34'. A layer 102 of a polymeric material such as acrylonitrile butadiene styrene (ABS) is positioned over and directly contacts the light guide 34. The layer 102 may be retained in contact with the light guide 34' using the friction fit of the multiple pins 48' which are received in opposed apertures 104 created in the layer 102, or the layer 102 can be overmolded onto the light guide 34'. According to several aspects the layer 102 is black in color and is substantially opaque and non-light transmissive. The partial cavity 60 of the light guide 34 is replaced with a similarly sized cavity 106 which is not filled with the conformal filler layer 62, and therefore contains air. To maintain the air in the cavity 106 between the light guide 34' and the body 12' a patch 108 discussed in greater detail in reference to FIG. 7 is placed over the through hole 64' and a similar aperture (described in reference to FIG. 7) created through the layer 102 which is co-axially aligned with the through hole 64'. According to several aspects, the cavity 106 also contains the light emitting diodes 20, 20', 20", 20'", 20"", 22, or the light emitting diodes 20, 20', 20", 20'", 20'", 22 may be located in a separate cavity in the light guide 34.

Figure 5:
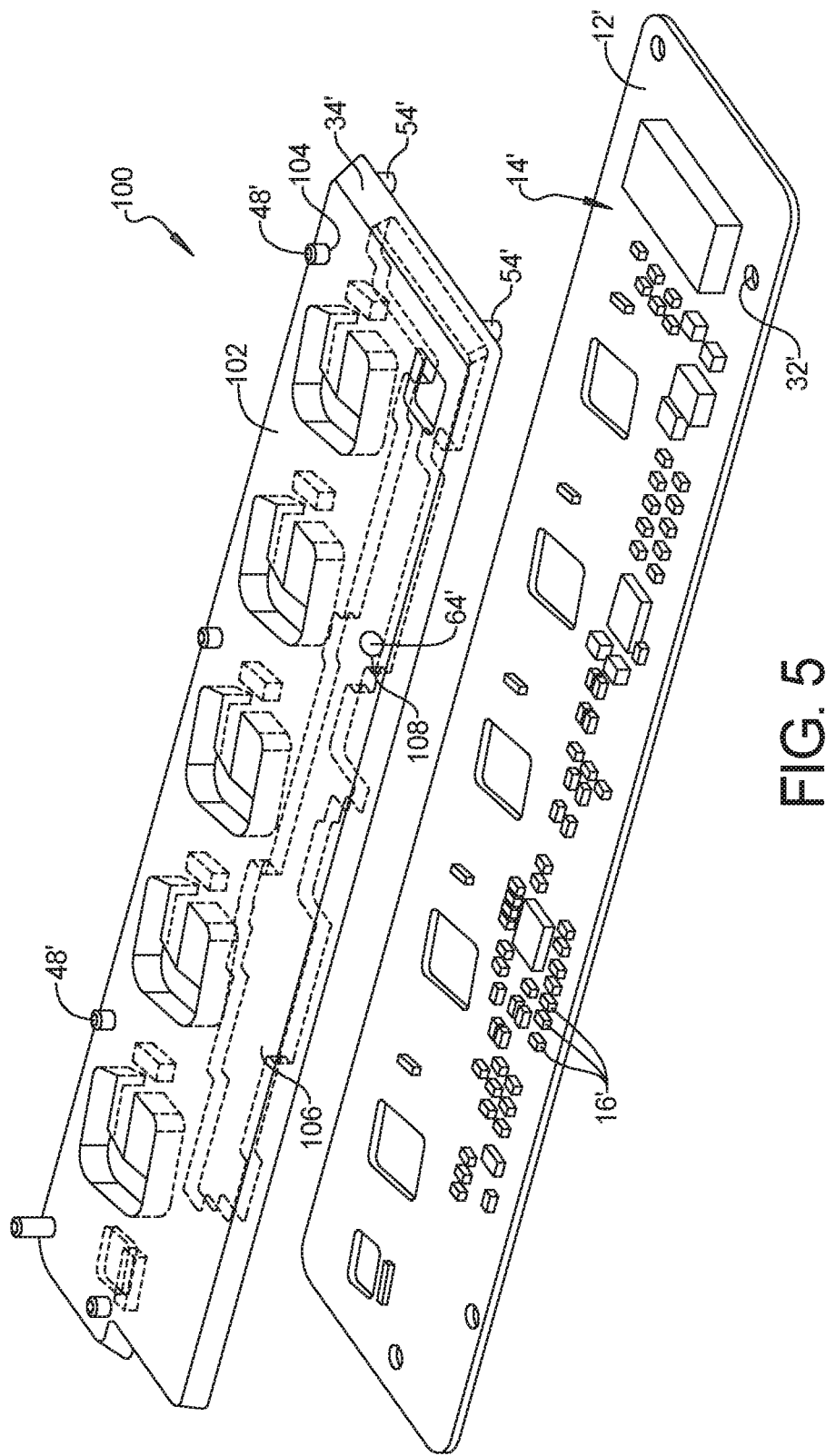
FIG. 5 is a front perspective assembly view of a molded component assembly according to another exemplary embodiment.

Referring to FIG. 6 and again to FIG. 5, the completed molded component assembly 100 having the patch 108 covering the apertures allows air cavitation over the electronics components 16' within the cavity 106 and precludes the electronics components 16' from being exposed to the high temperature and high pressure resin normally used for component encapsulation. To mitigate against damage that can be caused by expansion of heated air within the cavity 106, the through hole 64' is used as an air vent hole which allows the heated and expanding air during molding to escape the cavity 106 thereby protecting the electronics components 16' during the molding process.

Referring to FIG. 7 and again to FIGS. 5 and 6, during molding of the layer 102, a hollow pin (not shown) used in the mold is inserted into the through hole 64' and withdrawn after injection or overmolding of the layer 102, which thereby creates an alignment aperture 110 through the layer 102 which is co-axially aligned with the through hole 64'. To prevent water or moisture from backflowing into the cavity 106 via the alignment aperture 110 and the through hole 64' when the assembly 100 is affected by outside environmental conditions, the patch 108 is placed over the alignment aperture 110 and thereby also covers the through hole 64'. According to several aspects, the patch 108 is an expanded polytetrafluoroethylene material which repels liquid water, but allows water vapor and air to pass through, allowing air to enter and escape the cavity 106 but preventing water or moisture from entering the alignment aperture 110 or the through hole 64' which could damage the electronics components 16' within the cavity 106.

With continuing reference to FIG. 7, a film 112 of a non-light transparent or opaque material such is placed for example by adhesive bonding onto a surface 114 of the printed circuit board or body 12'. The film 112 provides locations through which information is back-lit when individual ones of the light emitting diodes are energized, as will be described in greater detail in reference to FIG. 8. According to several aspects, the opaque film 112 can be an acrylonitrile butadiene styrene (ABS) plastic. A coating layer 116 of a substantially transparent or translucent polymeric material such as PMMA is then applied over the film 110, providing a clear, protective coating over this face of the body 12'.

Referring to FIG. 8 and again to FIGS. 1 through 7, light generated by any of the light emitting diodes 20, 20', 20", 20''', 20'''' on the body 12' is blocked from passing through the opaque film 112 except at individual locations of multiple indicia 118, which define translucent openings defining successive number pairs, which are also visible through the substantially transparent coating layer 116. The indicia 118 are light transparent portions of the opaque film 112 which may be rendered as successive number pairs and are each individually aligned with one of the through apertures 24, 24', 24", 24''', 24'''' where maximum light enhancement is achieved by the light reflectors 40, 40', 40", 40''', 40''''. A separate window region 120 can be provided through the opaque film 112 for light generated by the light emitting diode 22.

A molded component defining a molded component assembly 10 of the present disclosure offers several advantages. These include provision of a light guide of a transparent polymeric material covering a printed circuit board, with the light guide having a cavity positioned over multiple electronics components mounted to the printed circuit board. A through hole is created in the light guide which opens into the cavity. The through hole can be used to inject a polymeric material to fill the cavity and thereby to encapsulate the electronics components. The through hole can also be used as an air vent hole for the cavity, leaving the cavity with an air volume after light guide installation. To prevent water entrance into the cavity, a patch of a polymeric material is positioned over the through hole.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A molded component assembly, comprising:
   a printed circuit board with a first face and an oppositely facing second face;
   a light emitting diode mounted on a first portion of the first face;
   an electronics component mounted on a second portion of the first face;
   a light guide of a light translucent polymeric material positioned proximate to the light emitting diode, the light guide including:
      a contact surface directly contacting the first portion of the first face; and
      a cavity created in the contact surface, the cavity positioned over the electronics component.

2. The molded component assembly of claim 1, wherein the light guide includes a through hole extending through a body of the light guide and opening into the cavity.

3. The molded component assembly of claim 2, wherein the light guide further includes:
   a light outlet aligned to receive visible light emitted from the light emitting diode; and
   an integrally formed light reflector positioned proximate to the light outlet.

4. The molded component assembly of claim 3, wherein:
   the printed circuit board includes a through aperture extending from the first face to the second face, with the light outlet aligned with the through aperture; and
   a distal end of the light reflector defining a substantially flat face having a geometry that substantially matches a geometry of the through aperture, with the distal end positioned substantially flush with the second face of the printed circuit board.

5. The molded component assembly of claim 3, further including a low pressure molding polymeric material injected through the through hole and filling the cavity and the light outlet and encapsulating the electronics component.

6. The molded component assembly of claim 2, further including:
   a layer of a polymeric material positioned over the light guide; and
   an alignment aperture extending clearly through the layer which is aligned with the through hole.

7. The molded component assembly of claim 6, further including a patch of a polymeric material covering the alignment aperture, the patch thereby also covering the through hole.

8. The molded component assembly of claim 7, wherein the patch is an expanded polytetrafluoroethylene material which repels liquid water, but allows water vapor and air to pass through, allowing air to enter and escape the cavity but preventing liquid water from entering the alignment aperture and the through hole.

9. The molded component assembly of claim 1, further including:
   a through hole extending through a body of the light guide and opening into the cavity; and
   a conformal filler layer of a low temperature and low pressure molded polymeric material created by injecting the polymeric material through the through hole into the partial cavity.

10. The molded component assembly of claim 9, wherein the conformal filler layer includes an overmolding portion over-molded onto and covering the electronics component, and directly contacting the first face of the body.

11. The molded component assembly of claim 10, wherein the conformal filler layer includes a filler member co-molded with and homogeneously connected to the overmolding portion by a bridge member, the filler member back-fills a cavity defining the light outlet.

12. The molded component assembly of claim 9, wherein the conformal filler layer is white in color to reflect visible light created when the light emitting diodes are energized preventing the visible light from escaping through the light guide.

13. The molded component assembly of claim 1, wherein the light guide includes a light emitting diode receiving pocket recessed into the contact surface, the pocket having a shape corresponding to a shape of the light emitting diode and sized to receive the light emitting diode when the contact surface directly contacts the first portion of the first face.

14. The molded component assembly of claim 13, wherein the pocket includes an incident surface, the incident surface including a texture to control transmission of visible light generated by the light emitting diode to the light guide.

15. A molded component assembly, comprising:
a printed circuit board with a first face and an oppositely facing second face;
multiple light emitting diodes mounted on a first portion of the first face;
multiple electronics components mounted on a second portion of the first face;
a light guide of a light translucent polymeric material positioned over the light emitting diodes and the electronic components, the light guide including:
a contact surface directly contacting the first portion of the first face except at locations of the light emitting diodes;
a cavity created in the contact surface, the electronics components located within the cavity when the contact surface directly contacts the first portion of the first face; and
a through hole extending through a body of the light guide and opening into the cavity.

16. The molded component assembly of claim 15, wherein the light guide further includes multiple light outlets individually aligned with one of the light emitting diodes to receive visible light emitted from the light emitting diodes, each of the light outlets defining an aperture having a generally U-shaped inner wall oriented substantially perpendicular to an outer surface of the light guide.

17. The molded component assembly of claim 16, wherein
the light guide further includes multiple integrally formed light reflectors individually positioned proximate to one of the light outlets, with each of the multiple light reflectors homogeneously connected to the light guide and each including a neck portion extending the light reflector at least partially into one of multiple through apertures created in the printed circuit board.

18. The molded component assembly of claim 15, further including:
a layer of a polymeric material positioned over the light guide;
an alignment aperture extending clearly through the layer which is aligned with the through hole; and
a patch of a polymeric material covering the alignment aperture, the patch thereby also covering the through hole, the patch of an expanded polytetrafluoroethylene material which repels liquid water, but allows water vapor and air to pass through, allowing air to enter and escape the cavity but preventing liquid water from entering the alignment aperture and the through hole.

19. The molded component assembly of claim 15, further including:
a first polymeric material injected through the through hole and overmolding the second portion of the first face encapsulating the electronics components; and
a second polymeric material positioned over the second face of the printed circuit board having translucent openings positioned over each of a plurality of through apertures created in the printed circuit board, the translucent openings defining successive number pairs.

20. A molded component assembly, comprising:
a printed circuit board with a first face and an oppositely facing second face;
multiple light emitting diodes mounted on a first portion of the first face, each of the light emitting diodes defining a side-firing diode having visible light emitted from the light emitting diodes directed generally parallel to the first face;
multiple electronics components mounted on a second portion of the first face;
a light guide of a light translucent polymeric material positioned over the light emitting diodes and the electronic components, the light guide including:
a contact surface directly contacting the first portion of the first face except at locations of the light emitting diodes;
a cavity created in the contact surface, the electronics components located within the cavity when the contact surface directly contacts the first portion of the first face;
a through hole extending through a body of the light guide and opening into the cavity;
multiple light outlets individually aligned with one of the light emitting diodes to receive visible light emitted from the light emitting diodes, each of the light outlets defining an aperture; and
multiple integrally formed light reflectors individually positioned proximate to one of the light outlets, each of the light reflectors including multiple beveled surfaces to reflect the visible light to the light outlets.

* * * * *